(12) United States Patent
Kamiya et al.

(10) Patent No.: US 8,546,836 B2
(45) Date of Patent: Oct. 1, 2013

(54) LIGHT-EMITTING ELEMENT

(75) Inventors: Masao Kamiya, Kiyosu (JP); Shinya Boyama, Kiyosu (JP); Yasuhisa Ushida, Kiyosu (JP)

(73) Assignee: Toyoda Gosei Co., Ltd., Kiyoshi-Shi, Aichi-Ken (JP)

( * ) Notice: Subject to any disclaimer, the term of this patent is extended or adjusted under 35 U.S.C. 154(b) by 77 days.

(21) Appl. No.: 13/067,588

(22) Filed: Jun. 10, 2011

(65) Prior Publication Data

US 2012/0049236 A1    Mar. 1, 2012

(30) Foreign Application Priority Data

Aug. 27, 2010  (JP) ................. 2010-190778

(51) Int. Cl.
*H01L 33/00* (2010.01)

(52) U.S. Cl.
USPC .................... 257/99; 257/E33.063

(58) Field of Classification Search
USPC ............................ 257/99, E33.063
See application file for complete search history.

(56) References Cited

U.S. PATENT DOCUMENTS

2006/0289883 A1   12/2006   Kim et al.
2008/0096297 A1    4/2008   Schiaffino et al.

FOREIGN PATENT DOCUMENTS

| JE | 2005-158788 A | 6/2005 |
| JP | 60-175468 A | 9/1985 |
| JP | 10-065213 A | 3/1998 |
| JP | 2002-016312 A | 1/2002 |
| JP | 2010-507246 A | 3/2010 |

OTHER PUBLICATIONS

Japanese Office Action dated Apr. 23, 2013, with partial English-language translation.

*Primary Examiner* — Marvin Payen
(74) *Attorney, Agent, or Firm* — McGinn IP Law Group, PLLC

(57) ABSTRACT

A light-emitting element includes a semiconductor laminated structure including a nitride semiconductor, and formed by laminating a first semiconductor layer of a first conductivity type, a light-emitting layer and a second semiconductor layer of a second conductivity type different from the first conductivity type, the first semiconductor layer being exposed by removing a part of the second semiconductor layer and the light-emitting layer, a concave portion formed in the exposed portion of the first semiconductor layer, a first electrode formed on the concave portion and being in ohmic contact with the first semiconductor layer, and a second electrode being in ohmic contact with the second semiconductor layer and formed surrounding the first electrode.

7 Claims, 9 Drawing Sheets

LIGHT-EMITTING ELEMENT

The present application is based on Japanese Patent Application No. 2010-190778 filed on Aug. 27, 2010, the entire contents of which are incorporated herein by reference.

BACKGROUND OF THE INVENTION

1. Field of the Invention

This invention relates to a light-emitting element with two types of electrodes formed on the same plane.

2. Description of the Related Art

JP-A-10-065213 discloses a semiconductor light-emitting element that a negative electrode is formed on the surface of an n-type contact layer, a positive electrode is formed on the surface of a p-type contact layer, and an irregularity is formed at an interface between the negative electrode and the n-type contact layer. JP-A-10-065213 reports that it is possible to reduce Vf (forward voltage) of the light-emitting element by forming the irregularity on the surface of the n-type contact layer.

SUMMARY OF THE INVENTION

However, in the light-emitting element disclosed in JP-A-10-065213, one or two negative electrodes are arranged on an outer peripheral side of the element, and in this configuration, electric current flows only in a portion of the negative electrode on the outer peripheral side as well as in the vicinity of the positive electrode, and the effect thereof is limited even when the irregularity is formed at the interface between the negative electrode and the n-type contact layer.

Accordingly, it is an object of the invention to provide a light-emitting element that can reduce the drive voltage.

(1) According to one embodiment of the invention, a light-emitting element comprises: a semiconductor laminated structure comprising a nitride semiconductor, and formed by laminating a first semiconductor layer of a first conductivity type, a light-emitting layer and a second semiconductor layer of a second conductivity type different from the first conductivity type, the first semiconductor layer being exposed by removing a part of the second semiconductor layer and the light-emitting layer;
a concave portion formed in the exposed portion of the first semiconductor layer;
a first electrode formed on the concave portion and being in ohmic contact with the first semiconductor layer; and
a second electrode being in ohmic contact with the second semiconductor layer and formed surrounding the first electrode.

In the above embodiment (1) of the invention, the following modifications and changes can be made.

(i) The concave portion comprises an inclined surface inclined with respect to a depth direction of the semiconductor laminated structure in plan view.

(ii) A plurality of the first electrodes are included and each shaped like a spot in plan view.

(iii) The first semiconductor layer comprises an n-type semiconductor layer and the second semiconductor layer comprises a p-type semiconductor layer, and wherein the first electrode is an n-side electrode and the second electrode is a p-side electrode.

(iv) The p-side electrode comprises an oxide semiconductor.

(v) The p-side electrode comprises a p-side contact electrode formed on the p-type semiconductor layer, and a p-side upper electrode formed on the p-side contact electrode.

(vi) The p-side upper electrode and the n-side electrode comprise a same material.

(vii) The p-side upper electrode and the n-side electrode comprise a lower part contacting the n-type semiconductor layer or the p-side contact electrode and comprising Ni or Cr, and an upper part formed on the lower part and comprising Au.

POINTS OF THE INVENTION

According to one embodiment of the invention, a light-emitting element is constructed such that a concave portion extending in the depth direction of an n-side contact layer is formed in the n-side contact layer, and an n-electrode extending in the depth direction is formed using the concave portion, so that it is possible to reduce the resistance between the n-electrode and the n-side contact layer to reduce the drive voltage of the light-emitting element. Especially the n-electrode extending in the depth direction is surrounded by a p-contact electrode in plan view, so that electrical current can flow from the n-electrode to the p-contact electrode in all directions to allow a significant reduction in the drive voltage.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

First Embodiment

Figure 1A:
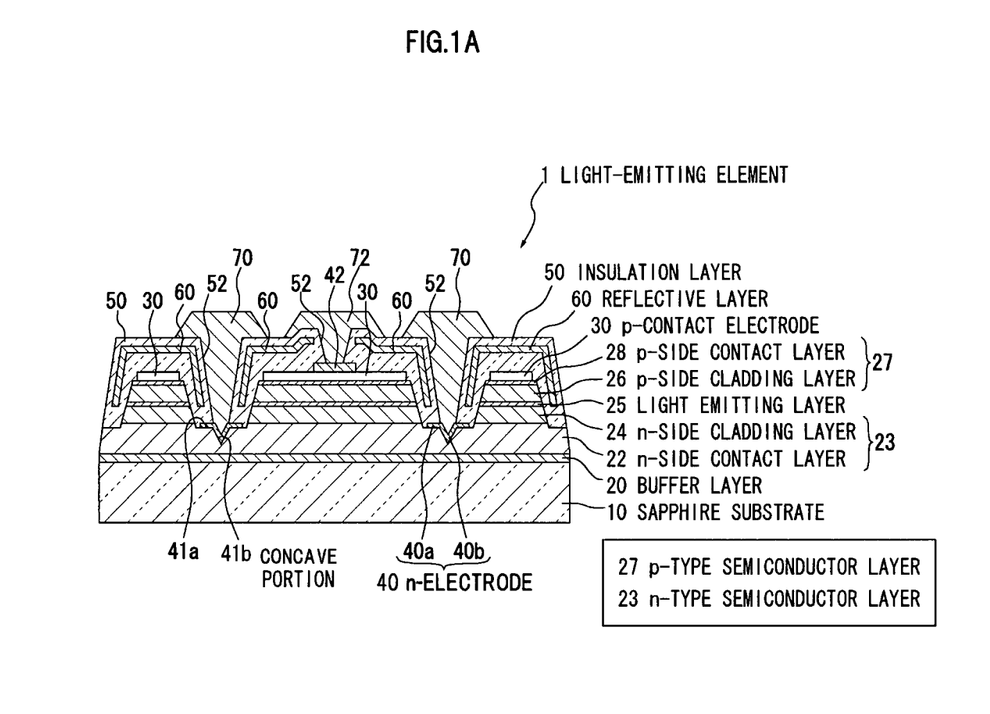
FIG. 1A is a vertical cross sectional view showing a light-emitting element in a first embodiment of the present invention.
Figure 1B:
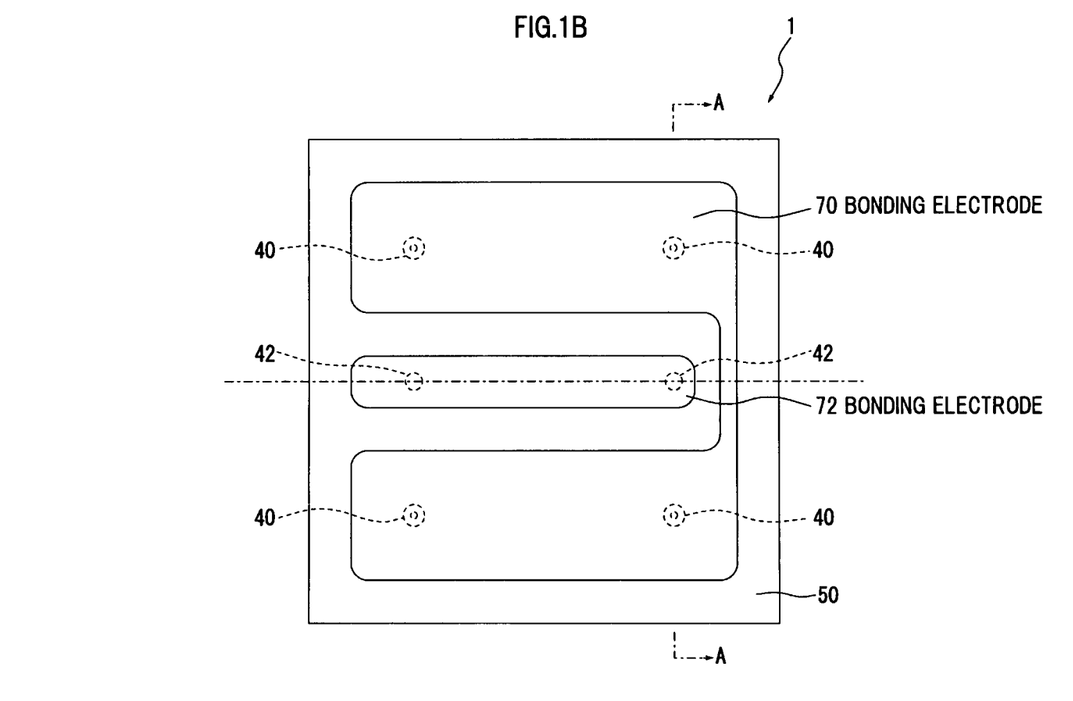
FIG. 1B is a plan view showing the light-emitting element in the first embodiment of the invention.

FIG. 1A schematically shows a vertical cross section of a light-emitting element in a first embodiment of the invention and FIG. 1B schematically shows an upper surface of the light-emitting element in the first embodiment of the invention. Here, FIG. 1A schematically shows a vertical cross section taken on line A-A of FIG. 1B.

As shown in FIG. 1A, a light-emitting element 1 has a semiconductor laminated structure including a sapphire substrate 10 having a C-plane (0001), a buffer layer 20 provided on the sapphire substrate 10, an n-side contact layer 22 as an n-type semiconductor layer provided on the buffer layer 20, an n-side cladding layer 24 provided on the n-side contact layer 22, a light-emitting layer 25 provided on the n-side cladding layer 24, a p-side cladding layer 26 provided on the light-emitting layer 25 and a p-side contact layer 28 as a p-type semiconductor layer provided on the p-side cladding layer 26.

In addition, the light-emitting element 1 is provided with an n-electrode 40 as a first electrode provided on the n-side contact layer 22 which is exposed by etching and removing a portion from the p-side cladding layer 28 at least to a surface of the n-side contact layer 22 (see FIG. 1B), a p-contact electrode 30 provided on the p-side contact layer 28, and a p-electrode 42 as a second electrode provided in a region on the p-contact electrode 30. The light-emitting element 1 is further provided with an insulation layer 50 as a passivation film which has an opening 52 for exposing a region for arranging the n-electrode 40 on the n-side contact layer 22 as well as another opening 52 for exposing a region for arranging the p-electrode 42 on the p-contact electrode 30, and a reflective layer 60 arranged inside the insulation layer 50. Still further, the light-emitting element 1 is provide with a bonding electrode 70 provided in the opening 52 above the n-electrode 40 so as to cover a portion of the upper surface of the insulation layer 50, and a bonding electrode 72 provided in the opening 52 above the p-electrode 42 so as to cover a portion of the upper surface of the insulation layer 50. Alternatively, the n-side bonding electrode 70 and the p-side bonding electrode 72 can be formed so as to have a barrier layer and a solder layer in this order from each electrode side.

Here, the buffer layer 20, the n-side contact layer 22, the n-side cladding layer 24, the light-emitting layer 25, the p-side cladding layer 26 and the p-side contact layer 28 are each formed of a group III nitride compound semiconductor. For the group III nitride compound semiconductor, it is possible to use, e.g., a quaternary group III nitride compound semiconductor represented by $Al_xGa_yIn_{1-x-y}N$ ($0 \le x \le 1$, $0 \le y \le 1$, and $0 \le x+y \le 1$).

In the present embodiment, the buffer layer 20 is formed of AlN. The n-side contact layer 22 and the n-side cladding layer 24 constitute an n-type semiconductor layer 23 as a first semiconductor layer of a first conductivity type, and are each formed of n-GaN doped with a predetermined amount of n-type dopant (e.g., Si). Meanwhile, the light-emitting layer 25 has a multiquantum well structure including InGaN/GaN/AlGaN. In addition, the p-side cladding layer 26 and the p-side contact layer 28 constitute a p-type semiconductor layer 27 as a second semiconductor layer of a second conductivity type different from the first conductivity type, and are each formed of p-GaN doped with a predetermined amount of p-type dopant (e.g., Mg).

Meanwhile, the p-contact electrode 30 of the present embodiment is formed of an oxide semiconductor, e.g., is formed of ITO (Indium Tin Oxide). Then, the insulation layer 50 is formed mainly of, e.g., silicon dioxide ($SiO_2$). In addition, the reflective layer 60 is provided inside the insulation layer 50 and is formed of a metal material which reflects the light emitted from the light-emitting layer 25. The reflective layer 60 is formed of, e.g., Ag or Al.

As shown in FIG. 1A, the n-electrode 40 is provided in each of plural openings which are formed by removing plural compound semiconductor layers, from the n-side cladding layer 24 to the p-side contact layer 28, on the n-side contact layer 22. In addition, on an upper surface of the n-electrode 40 with which the bonding electrode 70 is in contact, an outer rim portion of the n-electrode 40 not in contact with the bonding electrode 70 is in contact with the insulation layer 50.

Here, the exposed portion of the n-side contact layer 22 has a flat portion 41a which is substantially flat, and a concave portion 41b formed on the flat portion 41a. The n-electrode 40 is formed continuously on a surface of the concave portion 41b and on a surface of the flat portion 41a, and is in ohmic contact with the n-side contact layer 22. In the present embodiment, the concave portion 41b has an inverted conical shape centering a depth axis of the semiconductor laminated structure, and the n-electrode 40 has a slope 40b formed on an inclined surface of the concave portion 41b and a flat portion 40a formed on the flat portion 41a. Shapes of the n-electrode 40 and the concave portion 41b in plan view are arbitrarily determined, and in the present embodiment, the n-electrode 40 and the concave portion 41b are formed in a concentric circular shape. Planar sizes of the n-electrode 40 and the concave portion 41b are also arbitrarily determined, and in the present embodiment, the n-electrode 40 has a diameter of 5.0 μm to 20.0 μm and the concave portion 41b has a diameter smaller than that of the n-electrode 40 within a range of 3.0 μm to 15.0 μm. In addition, a depth of the concave portion 41b is arbitrarily determined and is 1.0 μm in the present embodiment.

On the other hand, plural p-electrodes 42 are formed on the p-contact electrode 30. The p-contact electrode 30 is formed so as to be in ohmic contact with the p-side contact layer 28 and to surround the n-electrode 40 in plan view. In addition, on an upper surface of the p-electrode 42 with which the bonding electrode 72 is in contact, an outer rim portion of the p-electrode 42 not in contact with the bonding electrode 72 is in contact with the insulation layer 50.

The insulation layer 50 covers the p-contact electrode 30 excluding a region for forming the p-electrode 42, the above-mentioned mesa portion, and the n-side contact layer 22 excluding a region for forming the n-electrode 40. It should be noted that the n-electrode 40 and the p-electrode 42 are not directly visible in plan view as shown in FIG. 1B since the bonding electrodes 70 and 72 are exposed on the surface.

The n-electrode 40 is formed including at least one of metals selected from the group consisting of, e.g., Ni, Cr, Ti, Al, Pd, Pt, Au, V, Ir and Rh. Meanwhile, the p-electrode 42 has the uppermost layer consisting mainly of Au, and the lowermost layer in contact with the p-contact electrode 30 can be formed by laminating materials having a low contact resistance with the p-contact electrode 30.

When, for example, the n-electrode 40 and the p-electrode 42 are formed of the same material, it is preferable that each electrode be formed of a metal material containing Ni or Cr and Au. Especially when the n-side contact layer 22 is formed of n-type GaN, the n-electrode 40 can be formed including a Ni layer and an Au layer in this order from the n-side contact layer 22 side. Alternatively, the n-electrode 40 can be formed including a Cr layer and an Au layer in this order from the n-side contact layer 22 side. Meanwhile, when the p-contact electrode 30 is formed of an oxide semiconductor, the p-electrode 42 can be formed including a Ni layer and an Au layer in this order from the p-contact electrode 30 side. Alternatively, the p-electrode 42 can be formed including a Cr layer and an Au layer in this order from the p-contact electrode 30 side.

The n-side bonding electrode 70 and the p-side bonding electrode 72 are in contact with a surface of the insulation layer 50 opposite to the p-contact electrode 30 (i.e., the upper surface in FIG. 1A), and cover a predetermined region of the surface of the insulation layer 50. The p-side bonding electrode 72 is formed in a substantially rectangular shape in plan view, and the n-side bonding electrode 70 is formed in a squared U-shape which semi-surrounds the p-side bonding electrode 72 in plan view.

The n-side bonding electrode 70 and the p-side bonding electrode 72 have a metal layer as a barrier layer consisting mainly of Ti at a portion in contact with the insulation layer 50. In addition, each of the bonding electrodes 70 and 72 can have a solder layer formed of a eutectic material, e.g., AuSn, on the barrier layer. It is possible to form the solder layer by, e.g., a vacuum deposition method (e.g., a beam deposition method or a resistance heating deposition method, etc.), a sputtering method, a plating method or a screen printing method, etc. Alternatively, the solder layer can be formed of eutectic solder consisting of a eutectic material other than AuSn or Pb-free solder such as SnAgCu.

In detail, the barrier layer can be formed including a first barrier layer which is in contact with the insulation layer 50, the n-electrode 40 or the p-electrode 42, and a second barrier layer formed on the first barrier layer for suppressing diffusion of the material constituting the solder layer. The first barrier layer is formed of a material with good adhesion and in ohmic contact with the material constituting the n-electrode 40 and the material constituting p-electrode 42, e.g., is formed mainly of Ti. Meanwhile, the second barrier layer is formed of a material capable of suppressing the diffusion of the material constituting the solder layer to the n-electrode 40 and the p-electrode 42 sides, e.g., is formed mainly of Ni.

The light-emitting element 1 configured as described above is a flip-chip light-emitting diode (LED) which emits light with a wavelength in a blue region. The light-emitting element 1 emits, e.g., light having a peak wavelength of 450 nm when forward voltage is 2.8V and forward current is 20 mA. In addition, the light-emitting element 1 is formed in a substantially square shape in plan view. A planar size of the light-emitting element 1 is, e.g., substantially 350 μm in length and width, respectively. Note that, the light-emitting element 1 is applicable to a face-up type LED in addition to the above-mentioned flip-chip LED since a p-electrode and an n-electrode are provided on the same plane.

Each layer provided on the sapphire substrate 10, from the buffer layer 20 to p-side contact layer 28, can be formed by, e.g., metalorganic chemical vapor deposition (MOCVD) method, molecular beam epitaxy (MBE) method or halide vapor phase epitaxy (HVPE) method, etc. The buffer layer 20 formed of AlN is shown as an example here, however, the buffer layer 20 can be formed of GaN. Meanwhile, the light-emitting layer 25 can have a single quantum well structure or a strained quantum-well structure instead of the multiquantum well structure.

Alternatively, the insulation layer 50 can be formed of metal oxide such as titanium oxide ($TiO_2$), alumina ($Al_2O_3$) or tantalum pentoxide ($Ta_2O_5$), or a resin material having electrical insulation properties such as polyimide. Meanwhile, the reflective layer 60 can be formed of Ag, or an alloy consisting primarily of Al or Ag. Additionally, the reflective layer 60 may be a distributed Bragg reflector (DBR) formed of plural layers of two materials having different refractive indexes.

Furthermore, the light-emitting element 1 may be a LED which emits light having a peak wavelength in an ultraviolet, near-ultraviolet or green region, however, the region of the peak wavelength of the light emitted by the LED is not limited thereto. The planar size of the light-emitting element 1 is not limited thereto in other modifications. The planar size of the light-emitting element 1 can be designed to be, e.g., 1 mm in length and width, respectively, or the length and width can be different from each other.

Figure 2A:
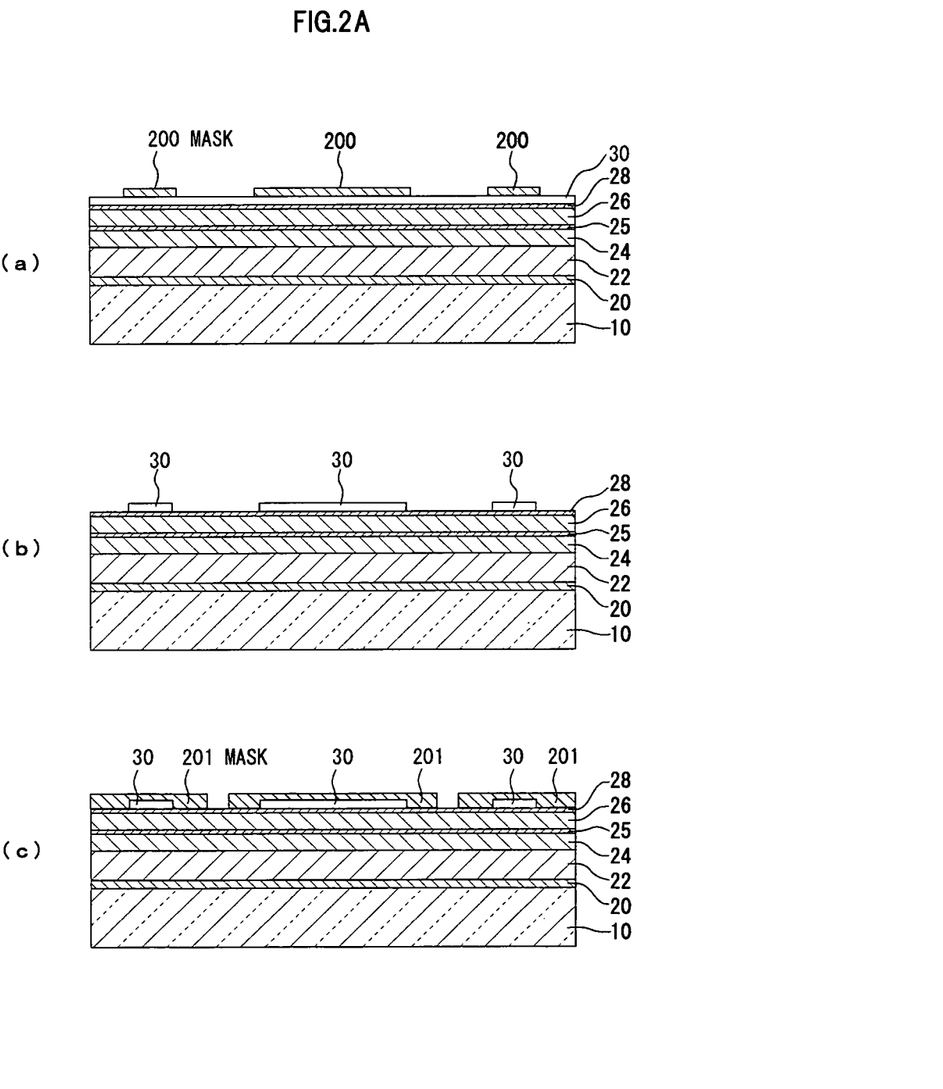
FIG. 2A is a schematic view showing a manufacturing process of the light-emitting element in the first embodiment of the invention.

FIGS. 2A to 2D show an example of manufacturing processes of the light-emitting element in the first embodiment. In detail, FIG. 2A(a) is a vertical cross sectional view before etching for forming a p-contact electrode is performed. FIG. 2A(b) is a vertical cross sectional view after the p-contact electrode is formed by etching. In addition, FIG. 2A(c) is a vertical cross sectional view showing the state in which a mask for forming a concave portion between the p-contact electrodes is formed.

Firstly, the sapphire substrate 10 is prepared, and a semiconductor laminated structure which includes an n-type semiconductor layer, a light-emitting layer and a p-type semiconductor layer is formed on the sapphire substrate 10. In detail, the buffer layer 20, the n-side contact layer 22, the n-side cladding layer 24, the light-emitting layer 25, the p-side cladding layer 26, the p-side contact layer 28 and the p-contact electrode 30 are epitaxially grown in this order on the sapphire substrate 10, thereby forming an epitaxial growth substrate. In the present embodiment, the p-contact electrode 30 is formed of ITO and can be formed by a sputtering method, a vacuum deposition method, a CVD method or a sol-gel method, etc. Then, a mask 200 of photoresist is formed by using photolithography technique in a region where the p-contact electrode 30 will be left (FIG. 2A(a)). The mask 200 is formed so as to have an opening portion in a region corresponding to a portion in which the concave portion 41b is formed later.

Next, the region excluding the portion in which the mask 200 is formed is etched, and the mask 200 is subsequently removed. As a result, the p-contact electrode 30 is formed (FIG. 2A(b)). Following the above, a mask 201 having an opening portion in a region corresponding to a portion in which the concave portion 41b is formed is formed on the p-contact electrode 30 and the p-side contact layer 28 by using photolithography technique (FIG. 2A(c)).

Figure 2B:
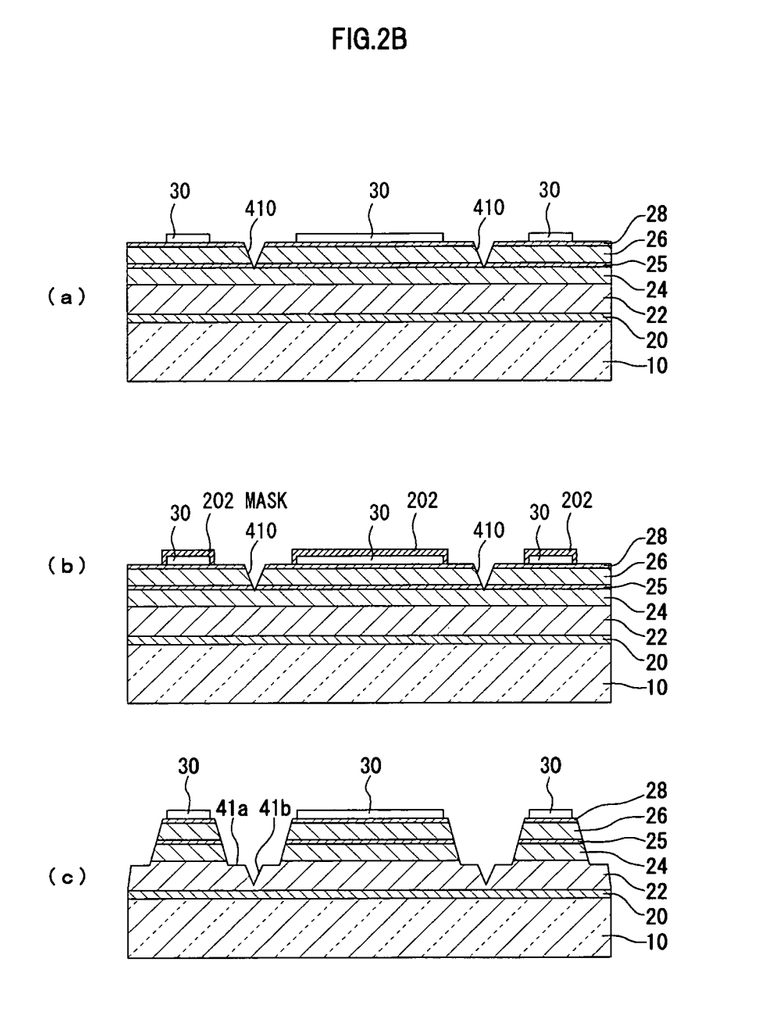
FIG. 2B is a schematic view showing a manufacturing process of the light-emitting element in the first embodiment of the invention.

FIG. 2B(a) is a vertical cross sectional view after the concave portion is formed by etching. FIG. 2B(b) is a vertical cross sectional view before etching for exposing a surface of an n-contact layer is performed. FIG. 2B(c) is a vertical cross sectional view after etching for forming the concave portion of the n-side contact layer is performed.

After the mask 201 is formed on the p-contact electrode 30 and the p-side contact layer 28, a portion not having the mask 201 thereon is etched, a concave portion 410 which has an inverted conical shape extending from the p-side cladding layer 28 toward the sapphire substrate 10 side is formed, and then, the mask 201 is removed (FIG. 2B(a)).

Next, a mask 202 covering the p-contact electrode 30 and a peripheral portion thereof is formed (FIG. 2B(b)). Then, a region in which the mask 202 is not formed is etched from the p-side contact layer 28 to the surface of the n-side contact layer 22 and the mask 202 is subsequently removed. As a result, a mesa portion composed of plural compound semiconductor layers, from the n-side cladding layer 24 to the p-side contact layer 28, is formed and the surface of the n-side contact layer 22 is partially exposed. In addition, the concave portion 41b is formed on the n-side contact layer 22 by this etching process since a portion having the concave portion 410 formed thereon is etched deeper than other portions (FIG. 2B(c)). Note that, forming the concave portion 41b by dry etching makes easy to form an inclined surface thereon even though an etching method is arbitrarily determined.

Figure 2C:
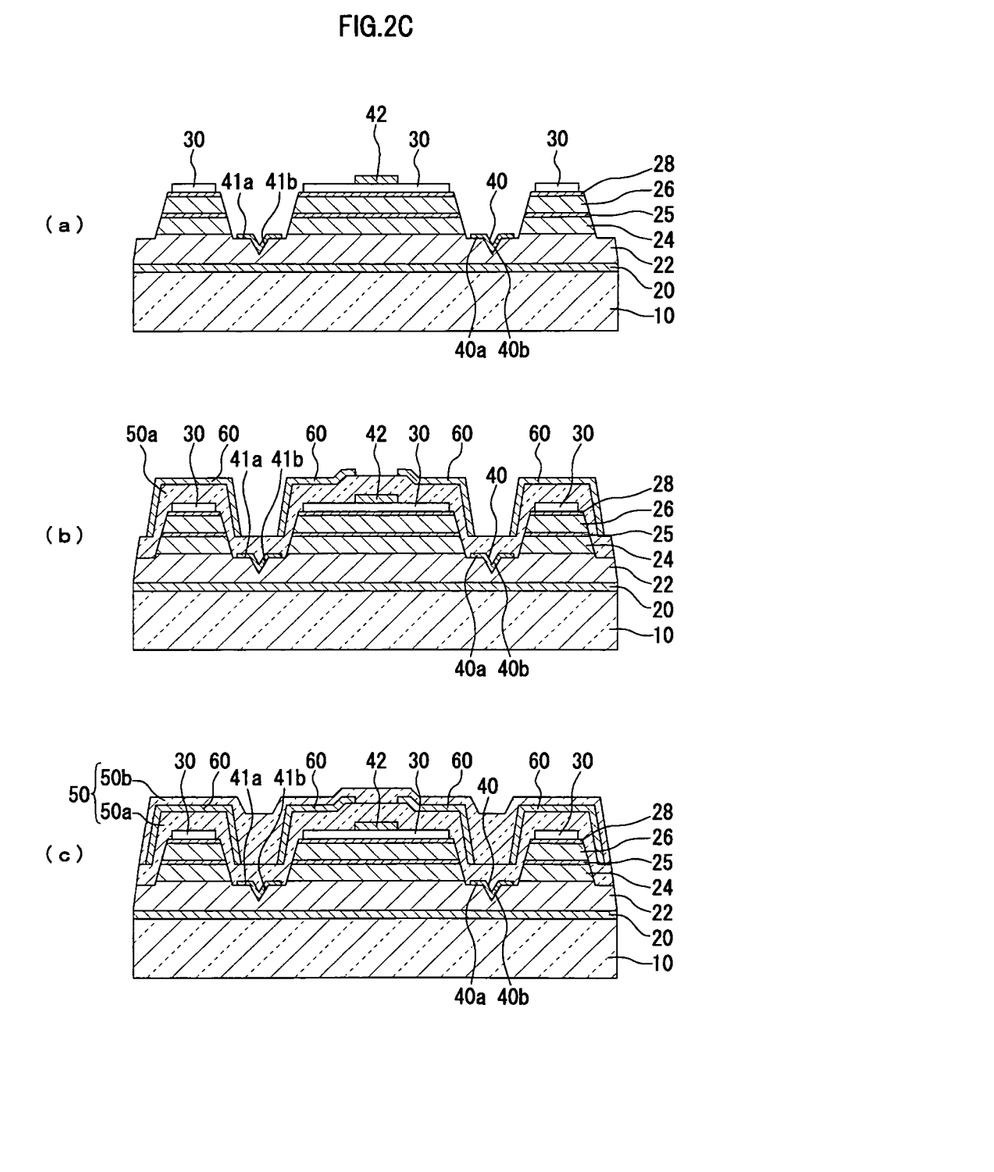
FIG. 2C is a schematic view showing a manufacturing process of the light-emitting element in the first embodiment of the invention.

FIG. 2C(a) is a vertical cross sectional view after an n-electrode is formed. FIG. 2C(b) is a vertical cross sectional view after a first insulation layer is formed. FIG. 2C(c) is a vertical cross sectional view after a reflective layer and a second insulation layer are formed.

Firstly, the n-electrode 40 is formed on the entire surface of the concave portion 41b on the n-side contact layer 22 and in a region of the flat portion 41a by using a vacuum deposition method and photolithography technique. Then, the p-electrode 42 is formed in a region of the surface of the p-contact electrode 30 provided on the p-side contact layer 28 by using a vacuum deposition method and photolithography technique (FIG. 2C(a)). The material constituting the n-electrode 40 and that constituting the p-electrode 42 may be the same or different from each other. When the both materials are the same, it is possible to simultaneously form the n-electrode 40 and the p-electrode 42. Alternatively, heat treatment at a predetermined temperature for a predetermined period of time in a predetermined atmosphere can be performed after forming the n-electrode 40 and the p-electrode 42 in order to ensure ohmic contact and adhesion between the n-side contact layer 22 and the n-electrode 40 and between the p-contact electrode 30 and the p-electrode.

Subsequently, the insulation layer 50 covering the n-electrode 40 and the p-electrode is formed. In detail, a first insulation layer 50a covering the n-side contact layer 22, the n-electrode 40, the mesa portion, the p-contact electrode 30 and the p-electrode 42 is formed by a vacuum deposition method. Then, the reflective layer 60 is formed in a predetermined region on the first insulation layer 50a excluding portions above the n-electrode 40 and the p-electrode 42 by using a vacuum deposition method and photolithography technique (FIG. 2C(b)). Next, by using a vacuum deposition method, a second insulation layer 50b is formed on the reflective layer 60 which is formed in the process shown in FIG. 2C(b) as well as on a portion not having the reflective layer 60 formed thereon (FIG. 2C(c)). As a result, the reflective layer 60 is covered by the second insulation layer 50b. Thus, the insulation layer 50 of the present embodiment is composed of the first insulation layer 50a and the second insulation layer 50b.

Figure 2D:
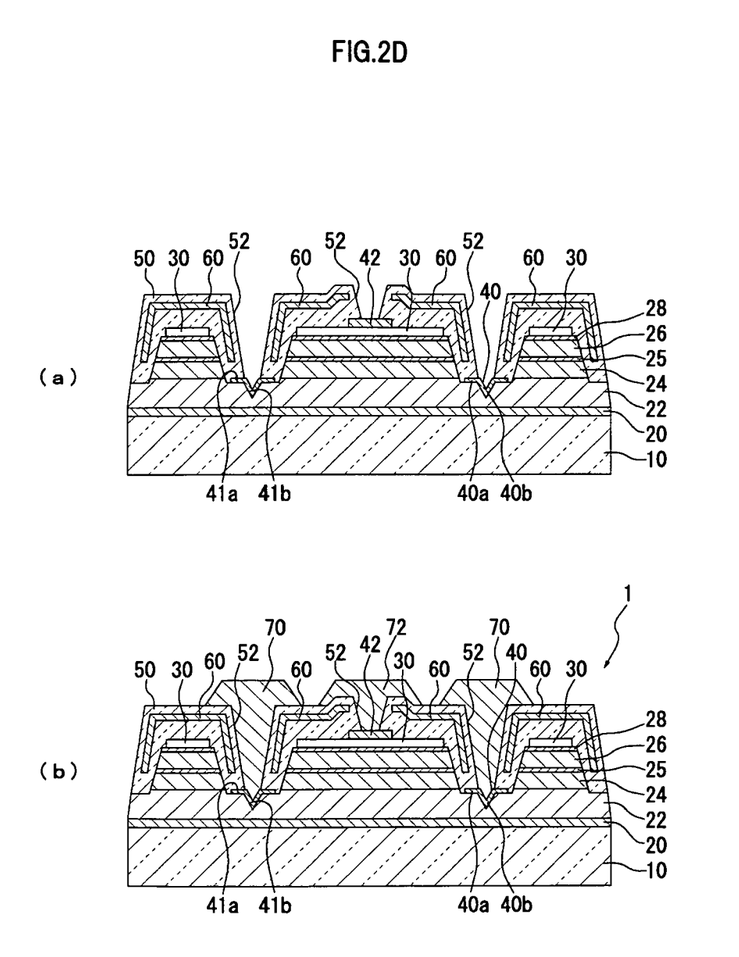
FIG. 2D is a schematic view showing a manufacturing process of the light-emitting element in the first embodiment of the invention.

FIG. 2D(a) is a vertical cross sectional view after an opening is formed on a portion of the insulation layer. In addition, FIG. 2D(b) is a vertical cross sectional view after a barrier layer and a solder layer are formed.

Following the above, portions of the insulation layer 50 on the n-electrode 40 and on the p-electrode 42 are removed by using photolithography technique and etching technique. As a result, the opening 52 as a through-hole is formed above the p-electrode 42 and the other opening 52 as a through-hole is formed above the n-electrode 40 (FIG. 2D(a)).

Next, a barrier layer is formed in each opening 52 by using a vacuum deposition method and photolithography technique. The barrier layer formed in the opening 52 above the n-electrode 40 is electrically connected to the n-electrode 40. Meanwhile, the barrier layer formed in the opening 52 above the p-electrode 42 is electrically connected to the p-electrode 42. Subsequently, a solder layer is formed on the barrier layer. As a result, the bonding electrode 70 composed of the barrier layer and the solder layer is formed, and the light-emitting element 1 shown in FIG. 2D(b) is thereby manufactured.

Alternatively, the n-electrode 40 and the p-electrode 42 can be each formed by a sputtering method. In addition, the insulation layer 50 can be formed by a chemical vapor deposition (CVD) method. Then, the light-emitting element 1 formed through the above processes is mounted by flip-chip bonding at a predetermined position on a substrate of ceramic, etc., having a wiring pattern of conductive material preformed thereon. Then, the light-emitting element 1 can be packaged as a light-emitting device by integrally sealing the light-emitting element 1 mounted on the substrate with sealant such as epoxy resin or glass.

In the light-emitting element 1 of the present embodiment, the concave portion 41b extending in the depth direction of the n-side contact layer 22 is formed in the n-side contact layer 22 and the n-electrode 40 extending in the depth direction is formed using the concave portion 41b. Thereby, it is possible to reduce the resistance between the n-electrode 40 and the n-side contact layer 22 to reduce the drive voltage of the light-emitting element 1. Since especially the n-electrode 40 extending in the depth direction is surrounded by the p-contact electrode 30 in plan view, electrical current can flow from the n-electrode 40 to the p-contact electrode 30 in all directions so as to allow a significant reduction in the drive voltage.

In addition, since the n-electrode 40 has the slope 40b, it is possible to reflect the light emitted from the light-emitting layer 25 in an axial direction. As a result, it is possible to improve brightness of the light-emitting element 1 in an axial direction.

Second Embodiment

Figure 3A:
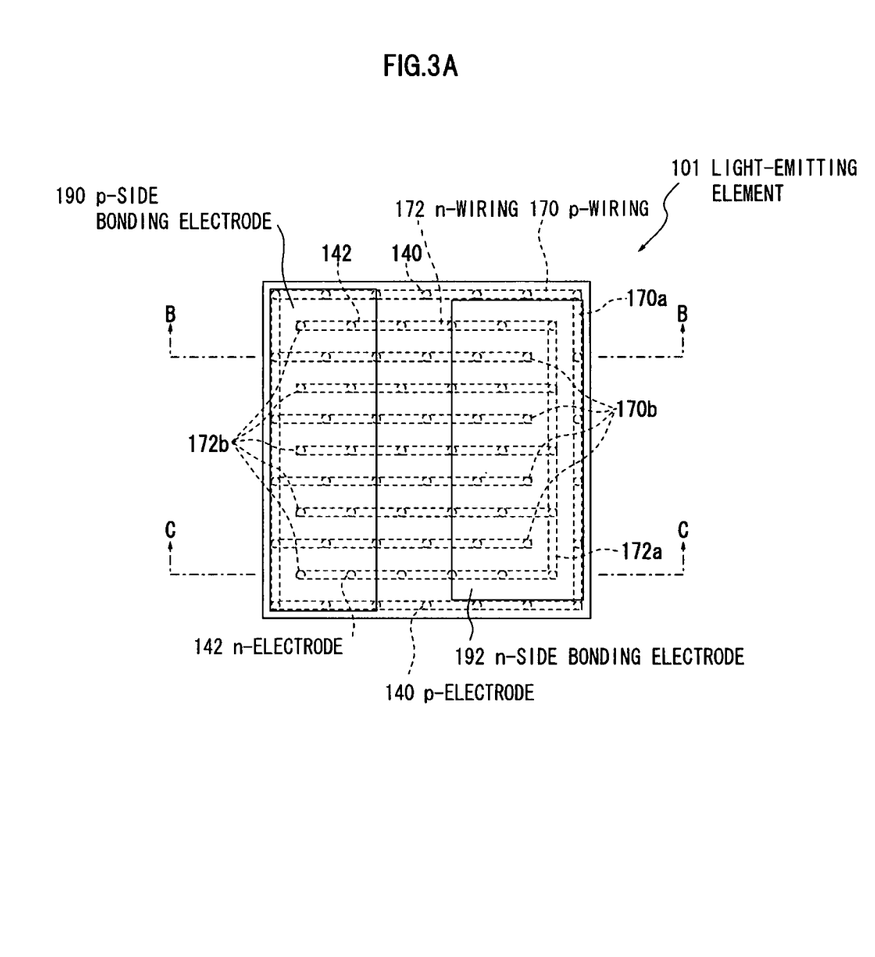
FIG. 3A is a plan view showing a light-emitting element in a second embodiment of the invention.
Figure 3B:
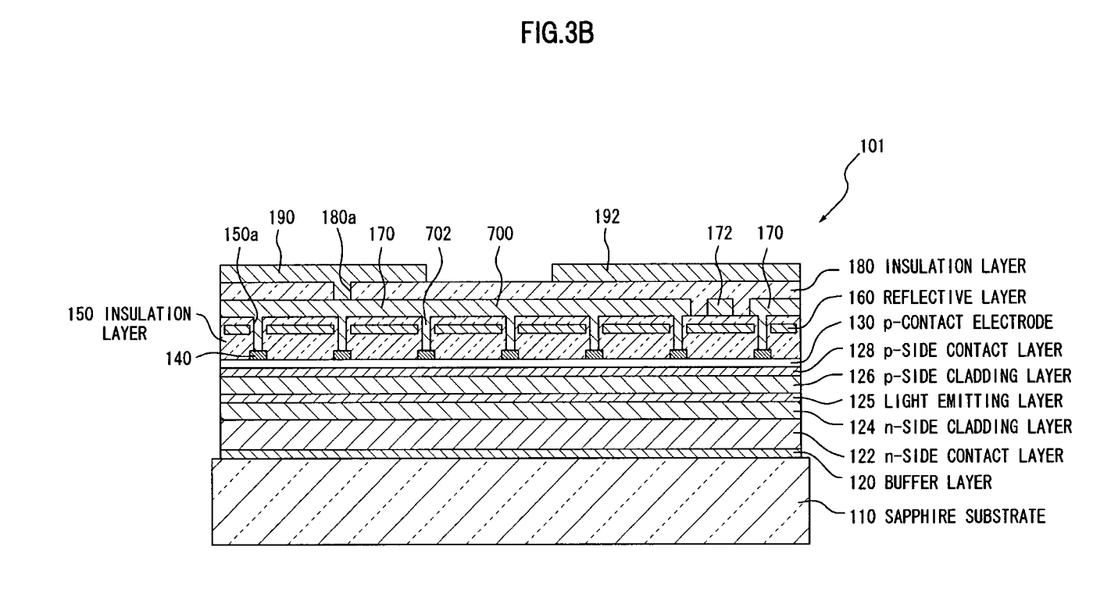
FIG. 3B is a vertical cross sectional view showing the light-emitting element in the second embodiment of the invention.
Figure 3C:
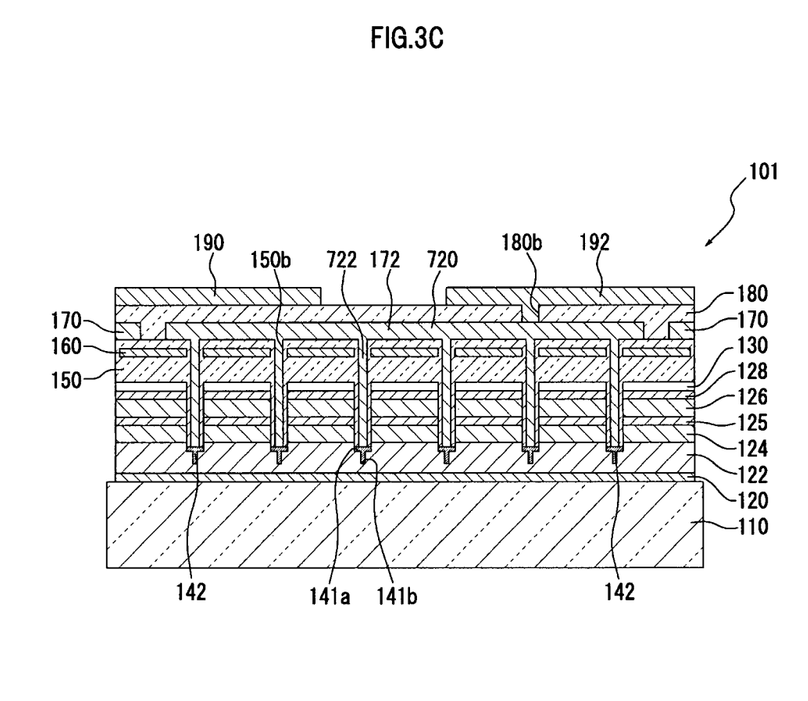
FIG. 3C is a vertical cross sectional view showing the light-emitting element in the second embodiment of the invention.

FIG. 3A schematically shows an upper surface of a light-emitting element in a second embodiment of the invention and FIGS. 3B and 3C schematically show vertical cross sections of the light-emitting element in the second embodiment of the invention. In detail, FIG. 3B schematically shows a vertical cross section of the light-emitting element taken on line A-A of FIG. 3A and FIG. 3C schematically shows a vertical cross section of the light-emitting element taken on line B-B of FIG. 3A.

As shown in FIGS. 3B and 3C, a light-emitting element 101 of the second embodiment has a semiconductor laminated structure including a sapphire substrate 110, a buffer layer 120 provided on the sapphire substrate 110, an n-side contact layer 122 provided on the buffer layer 120, an n-side cladding layer 124 provided on the n-side contact layer 122, a light-emitting layer 125 provided on the n-side cladding layer 124, a p-side cladding layer 126 provided on the light-emitting layer 125 and a p-side contact layer 128 provided on the p-side cladding layer 126.

In addition, the light-emitting element 101 is provided with a p-contact electrode 130 provided on the p-side contact layer 128 and plural p-electrodes 140 provided in a region on the p-contact electrode 130. The p-contact electrode 130 is in ohmic contact with the p-side contact layer 128 and forms a second electrode which surrounds an n-electrode 142 in plan view. In addition, the light-emitting element 101 is provided with plural n-electrodes 142 provided on the n-side contact layer 122 exposed by plural vias which are formed in a portion from the p-side contact layer 128 at least to a surface of the n-side contact layer 122, a lower insulation layer 150 provided on an inner surface of the via and on the p-contact electrode 130, and a reflective layer 160 provided inside the lower insulation layer 150. The reflective layer 160 is provided in a portion excluding portions above the p-electrodes 140 and the n-electrodes 142.

Furthermore, the lower insulation layer 150 which is in contact with the p-contact electrode 130 has a via 150a extending in a vertical direction above each p-electrode 140 and a via 150b extending in a vertical direction above each n-electrode 142. In addition, a p-wiring 170 and an n-wiring 172 are provided on the lower insulation layer 150 in the light-emitting element 101. The p-wiring 170 has a second planar conducting portion 700 extending in a planar direction on the lower insulation layer 150 and plural second vertical conducting portions 702 electrically connected to each of the p-electrodes 140 through the vias 150a. Meanwhile, the n-wiring 172 has a first planar conducting portion 720 extending in a planar direction on the lower insulation layer 150 and plural first vertical conducting portions 722 electrically connected to each of the n-electrodes 142 through the vias 150b in the lower insulation layer 150 and vias formed in the semiconductor laminated structure. Furthermore, the light-emitting element 101 is provided with an upper insulation layer 180 provided on the lower insulation layer 150 which is in contact with the p-wiring 170, the n-wiring 172 and the p-contact electrode 130, a p-side bonding electrode 190 electrically connected to the p-wiring 170 through a p-side opening 180a provided in the upper insulation layer 180, and an n-side bonding electrode 192 electrically connected to the n-wiring 172 through an n-side opening 180b provided in the upper insulation layer 180.

In the present embodiment, the second planar conducting portion 700 of the p-wiring 170 and the first planar conducting portion 720 of the n-wiring 172 are each formed on the surface of the lower insulation layer 150 which is in contact with the p-contact electrode 130, and thus are provided on the same plane. Meanwhile, in the present embodiment, the p-side bonding electrode 190 and the n-side bonding electrode 192 are formed on the surface of the upper insulation layer 180, and thus are provided on the same plane.

Here, the buffer layer 120, the n-side contact layer 122, the n-side cladding layer 124, the light-emitting layer 125, the p-side cladding layer 126 and the p-side contact layer 128 are each formed of a group III nitride compound semiconductor. For the group III nitride compound semiconductor, it is possible to use, e.g., a quaternary group III nitride compound semiconductor represented by $Al_xGa_yIn_{1-x-y}N$ ($0 \le x \le 1$, $0 \le y \le 1$, and $0 \le x+y \le 1$).

In the present embodiment, the buffer layer 120 is formed of AlN. The n-side contact layer 122 and the n-side cladding layer 124 are each formed of n-GaN respectively doped with a predetermined amount of n-type dopant (e.g., Si). Meanwhile, the light-emitting layer 125 has a multiquantum well structure including plural well layers and plural barrier layers. The light-emitting layer 125 is formed of, e.g., GaN, InGaN or AlGaN, etc. In addition, the p-side cladding layer 126 and the p-side contact layer 128 are each formed of p-GaN doped with a predetermined amount of p-type dopant (e.g., Mg).

The p-contact electrode 130 is formed of conductive oxide. The p-contact electrode 130 can be formed of, e.g., ITO. Meanwhile, a material constituting the p-electrode 140 is the same as a material constituting the n-electrode 142. Note that, when the p-electrode 140 and the n-electrode 142 are formed of multiple layers, each has the same layer structure.

Additionally, the plural p-electrodes 140 are regularly arranged on the p-contact electrode 130 in the present embodiment. Likewise, the plural n-electrodes 142 are regularly arranged on a plane which is different, in a thickness direction of the light-emitting element 101, from the plane having the plural p-electrodes 140 provided thereon (arranged on an exposed surface of the n-side contact layer 122 in the present embodiment).

Here, a portion of the n-side contact layer 122 for forming the n-electrode 142 has a flat portion 141a which is substantially flat, and a concave portion 141b formed on the flat portion 141a. In the present embodiment, the concave portion 141b is formed in a substantially rectangular shape in cross section, and the n-electrode 142 fills the concave portion 141b and is also formed on the flat portion 141a.

In addition, as shown by dashed lines in FIG. 3A, the plural p-electrodes 140 are arranged at intervals along first and second axes in plan view when determining one side of the light-emitting element 101 as a first axis and assuming a side perpendicular to the above-mentioned one side as a second axis. In the present embodiment, the plural p-electrodes 140 are arranged at positions corresponding to lattice points of lattices having a predetermined lattice interval. Meanwhile, the plural n-electrodes 142 are arranged at intervals at positions not overlapping each of the p-electrodes 140 in plan view. In the present embodiment, each of the plural n-electrodes 142 is placed at the face center position of a square as the minimum square which is defined by four p-electrodes 140 arranged at four corners in plan view (i.e., at an intersection of two diagonal lines of the square). In other words, the p-electrodes 140 and the n-electrodes 142 are arranged at alternate positions with respect to the first and second axes. The p-electrode 140 and the n-electrode 142 can each have a substantially circular shape or a substantially polygonal shape (e.g., triangle, quadrangle, pentagon and hexagon, etc.) in plan view.

The lower insulation layer 150 is formed including the reflective layer 160 which reflects light emitted from the light-emitting layer 125. The lower insulation layer 150 is formed mainly of, e.g., silicon dioxide ($SiO_2$) as an insulating material. Meanwhile, the reflective layer 160 is formed of a metal material which reflects the light emitted from the light-emitting layer 125, e.g., Al.

Each of the p-wiring 170 and the n-wiring 172 can be formed containing mainly Ti, Au and Al. Each of the p-wiring 170 and the n-wiring 172 can be formed including, e.g., a Ti layer, an Au layer and an Al layer in this order from the side in contact with the lower insulation layer 150.

In addition, the p-wiring 170 has an outer peripheral portion 170a provided near and along an outer periphery of the light-emitting element 101 when the light-emitting element 101 is viewed from the top, as shown in FIG. 3A. The p-wiring 170 further has plural p-side thin line portions 170b extending from one side of the outer peripheral portion 170a toward an opposite side thereof. The plural p-side thin line portions 170b have substantially the same length in a longitudinal direction without being in contact with the above-mentioned opposite side, and are arranged at substantially equal intervals in a width direction.

Meanwhile, when the light-emitting element 101 is viewed from the top, the n-wiring 172 has a side portion 172a which extends in a direction perpendicular to the plural p-side thin line portions 170b and is arranged inside the outer peripheral portion 170a near the above-mentioned opposite side of the outer peripheral portion 170a, and plural n-side thin line portions 172b extending from the side portion 172a toward the above-mentioned one side. The plural n-side thin line portions 172b are each arranged between the outer peripheral portion 170a and the p-side thin line portion 170b or between two p-side thin line portions 170b at a position where the distance from the nearest outer peripheral portion 170a and the distance from the nearest p-side thin line portion 170b in plan view are substantially the same. Therefore, the plural p-side thin line portions 170b and the plural n-side thin line portions 172b are alternately arranged in plan view.

As shown in FIGS. 3B and 3C, the p-wiring 170 and the n-wiring 172 are electrically isolated by placing the upper insulation layer 180 between the first planar conducting portion 720 and the second planar conducting portion 700 in a planar direction. Then, an ohmic electrode function and a wiring function are separated by providing the p-wiring 170 and the n-wiring 172 between the lower insulation layer 150 and the upper insulation layer 180 aside from the p-electrode 140 and the n-electrode 142 which are in ohmic contact with a compound semiconductor layer. The upper insulation layer 180 can be formed of the same material as the lower insulation layer 150 which is in contact with the p-contact electrode 130, and the upper insulation layer 180 and the lower insulation layer 150 integrally form an insulation layer.

The p-side bonding electrode 190 and the n-side bonding electrode 192 can be formed each including a eutectic material, e.g., AuSn. The p-side bonding electrode 190 and the n-side bonding electrode 192 are each formed in a substantially rectangular shape in plan view. As for the size of the p-side bonding electrode 190 and the n-side bonding electrode 192 in plan view, the area of the p-side bonding electrode 190 can be larger than that of the n-side bonding electrode 192. The shapes and areas of the p-side bonding electrode 190 and the n-side bonding electrode 192 in plan view can be appropriately changed depending on the way of contact with a probe of a measuring device used for evaluating characteristics of the light-emitting element 101 and/or a mounting substrate for mounting the light-emitting element 101, etc.

In addition, the p-side bonding electrode 190 and the n-side bonding electrode 192 can be formed by, e.g., a vacuum deposition method (e.g., a beam deposition method or a resistance heating deposition method, etc.), a sputtering method, a plating method or a screen printing method, etc. Alternatively, the p-side bonding electrode 190 and the n-side bonding electrode 192 can be formed of eutectic solder consisting of a eutectic material other than AuSn or Pb-free solder such as SnAgCu. In addition, the p-side bonding electrode 190 and the n-side bonding electrode 192 can be formed having a barrier layer and a solder layer from the p-wiring 170 side and the n-wiring 172 side.

In detail, the barrier layer can be formed including a first barrier layer which is in contact with the p-wiring 170 and the n-wiring 172, and a second barrier layer formed on the first barrier layer for suppressing diffusion of the material constituting the solder layer. The first barrier layer is formed of a material with good adhesion and in ohmic contact with the materials constituting the p-wiring 170 and the n-wiring 172, e.g., is formed mainly of Ti. Meanwhile, the second barrier layer is formed of a material capable of suppressing the diffusion of the material constituting the solder layer to the p-wiring 170 side and the n-wiring 172 side, e.g., is formed mainly of Ni. It should be noted that the material constituting the p-side bonding electrode 190 can be the same as the material constituting the n-side bonding electrode 192.

In the light-emitting element 101 of the present embodiment, the concave portion 141b extending in the depth direction of the n-side contact layer 122 is formed in the n-side contact layer 122 and the n-electrode 142 extending in the depth direction is formed using the concave portion 141b. Thereby, it is possible to reduce the resistance between the n-electrode 142 and the n-side contact layer 22 to reduce the drive voltage of the light-emitting element 101. Since especially the n-electrode 142 extending in the depth direction is surrounded by the p-contact electrode 130 in plan view, electrical current can flow from the n-electrode 142 to the p-contact electrode 130 in all directions to allow a significant reduction in the drive voltage.

Although the second planar conducting portion 700 of the p-wiring 170 and the first planar conducting portion 720 of the n-wiring 172 are provided on the same plane in the present embodiment, it is possible to provide on difference planes. The height of the plane for providing the n-wiring 172 can be increased or lowered than the plane for providing the p-wiring 170 by, e.g., changing the thickness of the lower insulation layer 150 which is in contact with the p-contact electrode 130. As a result, the first planar conducting portion 720 and the second planar conducting portion 700 can be arranged to overlap in plan view, thereby improving the degree of freedom for designing the element. Furthermore, the size of the p-electrode 140 and the n-electrode 142 in plan view is not limited to the above-mentioned example. In addition, the arrangement of the p-electrode 140 and the n-electrode 142 is not limited to the above-mentioned example, neither. Therefore, the n-electrode 142 is not necessarily entirely surrounded by the p-contact electrode 130 as long as the p-contact electrode 130 is formed so as to surround at least more than half of a region around the n-electrode 142. In addition, the shape of the concave portion is not limited to the inverted conical shape, and it may be an inverted conical shape with a flat apex.

Although the embodiments of the invention has been described, the invention according to claims is not to be limited to the above-mentioned embodiments. Further, it should be noted that not all combinations of the features described in the embodiments are not necessary to solve the problem of the invention.

What is claimed is:

1. A light-emitting element, comprising:
   a semiconductor laminated structure comprising a nitride semiconductor, and formed by laminating a first semiconductor layer of a first conductivity type, a light-emitting layer and a second semiconductor layer of a second conductivity type different from the first conductivity type, the first semiconductor layer being exposed by removing a part of the second semiconductor layer and the light-emitting layer;
   a concave portion formed in the exposed portion of the first semiconductor layer,
   a first electrode formed on the concave portion and being in ohmic contact with the first semiconductor layer; and
   a second electrode being in ohmic contact with the second semiconductor layer and formed surrounding the first electrode,
   wherein a plurality of the first electrodes are included and each is shaped like a spot in plan view,
   wherein a plurality of the concave portions are included, and
   wherein the plurality of the first electrodes are each formed per single one of the plurality of the concave portions.

2. The light-emitting element according to claim 1, wherein the concave portion comprises an inclined surface inclined with respect to a depth direction of the semiconductor laminated structure in plan view.

3. The light-emitting element according to claim 1, wherein the first semiconductor layer comprises an n-type semiconductor layer and the second semiconductor layer comprises a p-type semiconductor layer, and
   wherein the first electrode is an n-side electrode and the second electrode is a p-side electrode.

4. The light-emitting element according to claim 3, wherein the p-side electrode comprises an oxide semiconductor.

5. The light-emitting element according to claim 4, wherein the p-side electrode comprises a p-side contact electrode formed on the p-type semiconductor layer, and a p-side upper electrode formed on the p-side contact electrode.

6. The light-emitting element according to claim 5, wherein the p-side upper electrode and the n-side electrode comprise a same material.

7. The light-emitting element according to claim 6, wherein the p-side upper electrode and the n-side electrode comprise a lower part contacting the n-type semiconductor layer or the p-side contact electrode and comprising Ni or Cr, and an upper part formed on the lower part and comprising Au.

* * * * *